United States Patent Office 3,756,834

Patented Sept. 4, 1973

3,756,834

ALLOY METALIZATIONS

Oliver Alton Short, Wilmington, Del., assignor to E. I. du Pont de Nemours and Company, Wilmington, Del.

No Drawing. Continuation-in-part of application Ser. No. 136,190, Apr. 21, 1971, which is a continuation-in-part of abandoned application Ser. No. 873,055, Oct. 31, 1969, which is a continuation-in-part of abandoned application Ser. No. 705,305, Feb. 14, 1968, and which in turn is a continuation-in-part of abandoned application Ser. No. 626,394, Mar. 28, 1967. This application June 6, 1972, Ser. No. 260,244

Int. Cl. C09d 5/24

U.S. Cl. 106—1 6 Claims

ABSTRACT OF THE DISCLOSURE

Metalizing compositions comprising alloys of three or more metals are used in ceramic capacitor electrodes and capacitors therefrom. The alloys have a critical surface area. The specific metals of the alloy are palladium, platinum and gold. The metalizing compositions are especially suitable for producing capacitors on ceramic dielectric substrates which contain bismuth stannate.

CROSS-REFERENCE TO RELATED APPLICATIONS

This is a continuation-in-part of U.S. patent application Ser. No. 136,190, filed Apr. 21, 1971; which is a continuation-in-part of U.S. patent application Ser. No. 873,055, filed Oct. 31, 1969, now abandoned; which is a continuation-in-part of U.S. patent application Ser. No. 705,305, filed Feb. 14, 1968, now abandoned; which is a continuation-in-part of U.S. patent application Ser. No. 626,394, filed Mar. 28, 1967, now abandoned.

BACKGROUND OF THE INVENTION

Metalizing compositions which are printed on prefired ceramic dielectrics and fired thereon to form capacitor electrodes customarily contain finely divide noble metal particles, a finely divided inorganic binder, and an inert vehicle. A major purpose of the inorganic binder is to secure the fired-on noble metal particles to the ceramic dielectric substrate. To provide this function, a firing temperature must be employed which causes the inorganic binder to soften and wet the ceramic dielectric substrate. It has been observed that higher adhesive values can be obtained with higher firing temperatures. Metalizing compositions which are printed on green (unfired) ceramic dielectric substrates contain no inorganic binder; consequently, the dielectric substrates (having a metalizing composition printed thereon) must be fired to its sintering temperature to bond the metal to the dielectric substrates and to cement the dielectric substrates into a monolithic block. However, when temperatures equal to or in excess of the melting point of the noble metal particles of the metalizing composition are used on unfired or prefired ceramic dielectrics, the metal particles draw back into globules forming noncontinuous fired-on coatings and defective electrical elements. To avoid the formation of these undesirable metal globules while using metalizing compositions containing the more abundant and less expensive noble metals such as gold and silver which melt at 1062° C. and 960° C., respectively, lower sintering temperatures must be used. The industry has recently demanded electrical capacitors which cannot be produced by using silver or gold because of the need for higher firing temperatures.

The industry has demanded a dielectric material having a higher dielectric constant than that of glass ceramic. It has become necessary to form the dielectric of a material having a much higher fusing temperature than that of glass. Substances such as barium or strontium titanate or titanium dioxide, having a sintering temperature of over 1200° C., are necessary for this purpose. With such dielectrics, finely divided noble metals such as gold or silver cannot be used since they fuse at temperatures over 960° C. and 1062° C., and draw into fine globules and produce noncontinuous electrode layers. This means that a metalizing composition which can be fired at higher temperature must be utilized. Noble metal powders of platinum, palladium, or similarly expensive noble metals have been the only materials heretofore available to be fired at the higher temperatures. However, noble metal powders which contain the less expensive of the higher firing metals, palladium, cannot be used on dielectrics which contain bismuth stannate for the reasons discussed hereafter.

Unfired, green ceramic capacitors are prepared by printing noble metal metalizing compositions on sheets of resin-bonded ceramic dielectrics. Many of these dielectrics may be stacked on top of each other to produce multilayer assemblies which are ultimately fired to produce monolithic ceramic capacitors. In the fabrication of ceramic dielectrics, many different ceramic formulations have been used to obtain different values of dielectric constant, dissipation factor, and temperature characteristics. One of the common constituents utilized in such formulations and mixed with alkaline earth titanates for control of electrical characteristic is bismuth stannate. It is common practice in the capacitor industry to use palladium as the electrode material when the dielectric contains no bismuth stannate and to use platinum when the dielectric contains bismuth stannate. Palladium is used for reasons of economy when this metal is acceptable, but a chemical reaction occurs between palladium of the electrode and bismuth stannate of the dielectric substrate which causes delamination or complete disruption of the capacitor. This necessitates the use of the much more expensive platinum in the presence of this additive (bismuth stannate).

Dielectrics containing bismuth stannate are usually formulated from barium, strontium, or calcium titanate and 0.1–12% by weight of bismuth stannate. A reaction between the bismuth stannate and palladium, probably involving a transfer of oxygen from the bismuth stannate to the palladium and subsequent release from the palladium in the range of 800° C., causes delamination or complete disruption of built up monolithic capacitors. Other possible additives to dielectrics which would act similarly when added in the same amounts as discussed above are bismuth oxide, tin oxide, zinc oxide, lead oxide, cadmium oxide, indium oxide, thallium oxide, and copper oxide. Platinum does not undergo this oxygen exchange and is a satisfactory electrode material but costs considerably more and is therefore not as economically desirable. It is well known that a slight economy can be made by blending about 20% palladium powder or gold powder with 80% platinum, but this is not sufficiently attractive in view of the complexity of forming mixed binary pastes.

More recently, binary noble metal alloys have been utilized as disclosed by U.S. Pat. 3,385,799. While the results obtained in accordance with the Hoffman invention are better than the prior art, there is still a need for metalizations which produce an excellent overall combination of electrical properties and low cost electrodes in addition to overcoming the deficiencies of the prior art.

Thus, there is a definite need for a metalizing composition and electrodes which can be fired at high temperatures and avoid the formation of undesirable metal globules. In addition, there is a strong need for a metalizing composition and electrodes which are relatively inexpensive and can be fired on ceramic dielectrics which contain bismuth stannate, oxides of bismuth and tin or other oxides listed above. This invention covers a series of alloy metalizing compositions that can be successfully and relatively inexpensively used to form fired-on electrodes on bismuth stannate-containing dielectric substrates, and capacitors therefrom.

SUMMARY OF THE INVENTION

This invention relates to highly useful alloy metalizing compositions which can be printed and fired to form electrodes on ceramic dielectrics and capacitors therefrom.

Accordingly, capacitors of this invention comprise at least one electrode and at least one counterelectrode having a layer of a ceramic dielectric material between the electrode(s) and counterelectrode(s), wherein said electrode and counterelectrode comprise an alloy which comprises, on a weight basis, 0.5–60% platinum, 20–50% palladium, and 20–50% gold.

Metalizing compositions, comprising an inert vehicle having dispersed therein the above-described alloys, can be used to form the fired-on capacitor electrodes. A novel metalizing composition of this invention comprises an inert liquid vehicle having dispersed therein a finely divided alloy powder which comprises, on a weight basis, 0.5–60% platinum, 20–50% palladium and 20–50% gold, wherein the alloy powder has an average surface area within the range 0.1–20 $m.^2$/gm. The alloy metals in the metalizing compositions and capacitor electrodes of this invention are characterized as not undergoing excessive oxygen exchange with base metal oxides (particularly the oxides of bismuth and tin) under firing conditions and thus being suitable for printing and firing on bismuth stannate-containing dielectrics. Therefore, when bismuth stannate-containing dielectric substrates are used in capacitors, the alloy metalizing compositions and alloy electrodes of this invention do not encounter the prior art problem involving the oxygen transfer from substrate metals to the electrode metals which causes delamination or complete disruption of built up monolithic capacitors. Additionally, these alloy compositions provide an excellent overall combination of electrical properties in various electronic products such as capacitors, resistors and conductors.

DETAILED DESCRIPTION

The particular metalizing compositions which are printed and fired to form electrodes on ceramic dielectrics contain certain finely divided alloys. The alloy must comprise 0.5–60% platinum, 20–50% palladium and 20–50% gold in order to produce the desired electrical characteristics and to overcome the deficiencies of the prior art, as discussed above. In addition, these alloys are relatively low cost in comparison with 100% platinum metalizing compositions which have similar performance characteristics.

In the alloys of the metalizations of the present invention, the high melting point noble metals Pt and Pd are desirable so that the substrate and the metalization thereon can be cosintered without melting of the conductor. The amount of Pt, however, should not exceed 60% for reasons of cost, and to minimize any possible catalytic activity of Pt with the binder in the substrate or with the vehicle. The maximization of Pd content in the alloy is desired due to its lower cost, coupled with its high melting point. A minimum of 20% Pd in the alloy provides a significant increase in alloy melting point versus noble metals such as gold; however, Pd should not exceed 50% of the alloy weight due to the reactivity of Pd with substrates such as those discussed above upon cosintering of substrate and metal at Pd levels of greater than 50%. Such substrate reactivity leads to blistering and delamination, or even shattering of capacitors, with alloys having more than 50% Pd, at high sintering temperatures; this is related to the level of easily reducible oxide additives in the substrate, such as bismuth stannate.

Gold is present as 20–50% of the alloy. Gold when substituted for Pt in the alloy does not exhibit the reactivity problem shown by excess Pd, and at least 20% gold is present to serve the function of minimizing reactivity with the substrate, as well as to reduce alloy cost. However, gold has a severe melting point depression effect upon the alloy (since gold melts at 1062° C.). At levels above 50% of the alloy, the melting point depressant effect of gold is too severe; hence, no more than 50% is employed in these alloys.

Preferred alloys contain 10–60% Pt, 20–50% Pd and 20–50% Au. One of the more preferred alloys consists essentially of 40–60% by weight of platinum, 20–40% by weight of palladium, and 20–40% by weight of gold.

Moreover, such finely divided metal alloys are dispersed in a liquid vehicle, preferably inert, to provide a metalizing composition that can be applied to the surface of ceramic dielectric and fired to form a fixed capacitor. Additionally, a finely divided inorganic binder may optionally be added to the metalizing composition if it is desired to print these alloys on prefired ceramic wafers and fire at a temperature below the sintering point of the dielectric.

It is pointed out that the metalizing compositions of the invention, in addition to being useful in the formation of capacitors, may also be used in forming electrically conductive paths (i.e., conductors) and electrically resistive paths (i.e., resistors).

The surface area of the alloy powder is a critical feature of this invention. As indicated above, the average surface area must be within the range of 0.1–20 $m.^2$/gm. Alloy particles having a surface area less than 0.1 $m.^2$/gm. produce either low capacitance, poor reproducibility and/or open circuits. On the other hand, alloy powders having a surface area greater than 20 $m.^2$/gm. produce high viscosity dispersions (pastes) which cannot be screen printed. Powders finer than 20 $m.^2$/gm. also have a tendency to "cake" and catalytically react with the vehicle and/or substrate. Therefore, the surface area of the alloy powders must be within the critical range set forth above in order to be within the scope of this invention. The criticality of surface area is shown by the comparative data of Example 4 below.

In preparing the metalizing composition of this invention, the alloy powders may be prepared as follows: sufficient metal compounds, preferably in the form of acidic chloride solutions, are mixed to produce the desired ratio of metals in the alloy to be formed. The metals are precipitated as hydroxides and ammonia complexes by adding diluted ammonium hydroxide until the pH is between 8 and 11. The mixed metal hydroxides and complex chlorides are then reduced with a reducing agent (e.g., hydrazine, hydroquinone, sodium sulfite) to yield the alloy powder. The coprecipitation method is the preformed procedure to produce the alloy powders.

The following examples are given to illustrate in detail the preferred method of preparing alloy particles in accordance with the teachings of this application; it is pointed out that these details are not to be taken as limitations of this invention.

Example 1

Acidic chloride solutions of platinum, palladium and gold were prepared by dissolving platinum, palladium and gold metal in a mixture of nitric and hydrochloric acids (aqua regia) and subsequently decomposing the nitric acid by continued boiling and repeated additions of hydrochloric acid. A platinum-palladium-gold alloy was prepared from 40.4 grams of a 29.7% acidic platinum chloride solution, 24 grams of a 25% acidic palladium chloride, and 32.4 grams of a 37% acidic gold chloride solution. These were mixed and diluted to 200 ml. with water; then 100 ml. of concentrated ammonia (28%), which was previously diluted with 150 ml. of water, was added to the solution of metals. At this point a precipitate was formed and the pH of the solution was 9.5. A solution of 25 grams hydrazine sulfate in 500 ml. water was added to the metal hydroxide precipitate to effect reduction. The precipitate formed was washed free of chloride, filtered and dried to yield an alloy powder. The alloy contained 40% platinum, 20% palladium and 40% gold. An X-ray examination indicated alloy formation. The average surface area of the powders was about 3 $m^2$./gm.

By varying the relative amonuts of the solution of the metal compounds used in Example 1, above, alloy powders can be prepared by the method of these examples having any desired metal ratios.

The metalizing compositions of the invention will usually, although not necessarily, be dispersed in an inert vehicle to form a paint or paste for application to ceramic dielectrics. The proportion of vehicle to solids (metal alloys, inorganic binder) may vary considerably depending upon the manner in which the paint or paste is to be applied and the kind of vehicle used. Generally, 10–90% by weight of vehicle will be used to produce a paint or paste of the desired consistency. Any liquid, preferably one that is inert towards the alloy powder, may be employed as the vehicle. Water or any of various organic liquids, with or without resin binders, thickening and/or stabilizing agents, and/or other common additives may be utilized as the vehicle. Examples of organic liquids that can be used are esters of higher alcohols, for example, the acetates and propionates; the terpenes such as pine oil, alpha- and beta-terpineol and the like; and solutions of resin binders such as the polymethacrylates of lower alcohols, or solutions of ethyl cellulose, and solvents such as pine oil and the monobutyl ether of ethylene glycol monoacetate (butyl—O—$CH_2CH_2$—$OCOCH_3$). A preferred vehicle for use in this invention consists of: hydrogenated rosin, ethyl cellulose, beta-terpineol, and kerosene. Such vehicles are disclosed in Short, U.S. Pat. 3,536,500. The vehicle may contain or be composed of volatile liquids to promote fast setting after applications; or it may contain waxes, thermoplastic resins or the like materials which are thermofluid so that the vehicle-containing composition may be applied at an elevated temperature to a relatively cold ceramic body upon which the composition sets immediately.

While metalizing compositions which are applied to green (unfired) dielectric substrates customarily consist essentially of metal powder and a vehicle, the metallizing compositions which are applied to pre-fired ceramic substrates usually contain an inorganic binder in addition to the metal powder and inert vehicle. Also, inorganic binders are used in resistor and conductor compositions. The inorganic binders used in the metalizing compositions of this invention may be composed of any glass or ceramic material which will melt at a temperature lower than the melting point of the alloy powder with which it is used and which will adhere well to the substrate onto which the metalizing composition is applied. The high melting point alloy powders used in the metalizing compositions of this invention will enable the metalizing compositions to be fired to higher temperatures than are possible when physical mixtures of the pure corresponding metals are used. It has been observed that greater adhesion to the substrate can be achieved with the higher temperatures which are made possible by the use of alloy powders. Any inorganic material which serves to bind the metals to the substrate can be used as the inorganic binder component. The inorganic binder can be any of the glass frits employed in metalizing compositions. Such frits are generally prepared by melting a glass batch composed of the desired metal oxides, or compounds which will produce the glass during melting, and pouring the melt into water. The coarse frit is then milled to a powder of the desired fineness. The patents to Larsen and Short, U.S. Pat. No. 2,822,279 and to Hoffman, U.S. Pat. No. 3,207,706, describe some frit compositions which can be employed either alone or in combination with glass wetting agents, such as bismuth oxide. Typical frit compositions usable as binders in the compositions of this invention include: lead borate, lead silicate, lead borosilicate, cadmium borate, lead-cadmium borosilicate, zinc borosilicate, and sodium-cadmium borosilicate frits. The average particle size of the inorganic binder should be no larger than 40 microns, preferably within the range of 1–5 microns.

When inorganic binders are present in the metalizing compositions, the binders should always be present in sufficient quantities to provide adequate adhesion, for example, in amounts equal to or in excess of 1% of the combined amount of alloy powder and inorganic binder, also known as the solids content of the metalizing composition. A desirable range for the binder is from 1–95% of the combined weight of alloy powder and inorganic binder. For use as conductive paths on substrate surfaces, 1–25% frit is preferred, and 1–15% is optimum. For use as inner electrodes in capacitors, 0–25% frit is useful, and 0–15% is preferred.

The present metalizing compositions can be printed and fired on various types of ceramic dielectrics including those composed of forsterite, steatite, beryllium oxide, titanium oxide, barium titanate, alumina or zircon porcelain. Any other conventional unfired (green) dielectrics or prefired dielectrics can be used. Of course, their most important utility is for use on bismuth stannate-containing dielectrics, particularly dielectrics that contain at least 0.1% by weight of bismuth stannate.

The invention is further illustrated by the following examples. In the examples and elsewhere in the specification all parts, ratios and percentages of material or components are by weight.

Various metalizing compositions were prepared employing finely divided metal alloys dispersed in an inert liquid vehicle. The surface areas of the metal alloys ranged from 1–5 $m.^2$/gm. The inert liquid vehicle consisted of: 30% hydrogenated rosin, 6% ethyl cellulose, 2.5% beta-terpineol, and 61.5% kerosene. In all of the examples, the weight ratio of alloy powder to vehicle was 60% alloy metal/40% vehicle. Capacitors, comprising at least one electrode and at least one counterelectrode having a ceramic dielectric material between the electrode and counterelectrode, wherein the electrode and counterelectrode comprise an alloy which was prepared from applying and firing the alloy metalizing compositions of this invention, were produced. The metalizing compositions were screen-printed on polymethyl methacrylate (PMA) resin bonded to ceramic sheets. The sheets contained 10% PMA and 79.4% of barium strontium titanate with 10.6% bismuth stannate. Electrode prints were applied to all of the PMA sheets. For purposes of identification, the first electrode print is designated as the electrode; the second print is designated as counterelectrode, etc. After drying, eight printed sheets were stacked on top of each other. When the eight printed sheets had been stacked or "built up" and an unprinted top or cover sheet placed thereover, the stack was carefully compressed under a hydrolytic press at a pressure of about 10,000 p.s.i. Then the stack of sheets was fired to 2300° F. (unless indicated otherwise) for several hours to form a monolithic capacitor structure. The particular alloys used and results obtained are described below in the examples.

Example 2

An alloy containing 50% platinum, 25% palladium, and 25% gold was used. A satisfactory capacitor was produced.

Example 3

An alloy containing 40% platinum, 20% palladium, and 40% gold was used. A satisfactory capacitor was produced.

Example 4

An alloy containing 40% platinum, 30% palladium, and 30% gold was used. This composition performed satisfactorily and a good capacitor was produced. In comparison, an alloy powder, having the same metal constituents and proportions thereof, with an average surface area of 0.01 $m.^2/gm.$ was utilized to produce a capacitor as described above. The capacitor had no capacitance and resulted in an open circuit. Also in contrast, a similar alloy powder having a surface area of 30 $m.^2/gm.$ was dispersed in the liquid vehicle. The paste was too viscous to screen print and caking occurred. Thus, alloy powders having surface areas outside of the critical range of this invention did not perform satisfactorily.

By using the teachings of this invention, metalizing compositions containing lower cost alloys can be printed and fired on bismuth stannate-containing dielectrics to form very satisfactory and commercially acceptable capacitors. The capacitors produced by this invention perform satisfactorily and do not undergo any blistering or other disruptions (e.g., delaminations). Of course in addition to the preferred utility relating to capacitor electrodes, the present metalizing compositions can be used to make resistors and conductors for various electronic applications in accordance with conventional procedures, such as disclosed by D'Andrea, U.S. Pat. 2,924,540; Dumesnil, U.S. Pat. 3,052,573; and Wagner, U.S. Pat. 3,347,799. It is pointed out that other metals can be included in the alloys (as previously described) as long as amounts of platinum, palladium and gold within the specified ranges (e.g., 0.5–60%, 20–50% and 20–50%, respectively), even though the exemplified embodiments do not show this aspect of the invention.

I claim:

1. In a screen printable alloy metalizing composition comprising an inert liquid vehicle having dispersed therein a noble metal alloy powder, the improvement comprising a finely divided alloy powder which consists essentially of, on a weight basis, 0.5–60% platinum, 20–50% palladium and 20–50% gold, having an average surface area within the range 0.1–20 $m.^2/gm.$

2. A metalizing composition in accordance with claim 1 wherein the alloy comprises, on a weight basis, 40–60% platinum, 20–40% palladium and 20–40% gold.

3. A metalizing composition in accordance with claim 1 which further comprises an inorganic glass frit binder present in an amount within the range of 1–95% of the combined weight of alloy powder and inorganic binder.

4. A screen printable alloy metalizing composition in accordance with claim 1 wherein the alloy powder is a coprecipitated powder.

5. A metalizing composition in accordance with claim 1 wherein the alloy comprises, on a weight basis, 10–60% platinum, 20–50% palladium and 20–50% gold.

6. A metalizing composition in accordance with claim 3 wherein said binder is present in an amount within the range of 1–15% of the combined weight of alloy powder and binder.

References Cited

UNITED STATES PATENTS

| | | | |
|---|---|---|---|
| 3,401,126 | 9/1968 | Miller et al. | 106—1 |
| 3,440,182 | 4/1969 | Hoffman | 106—1 |
| 3,480,566 | 11/1969 | Hoffman | 106—1 |
| 3,484,284 | 12/1969 | Dates et al. | 106—1 |

LORENZO B. HAYES, Primary Examiner

U.S. Cl. X.R.

117—123 C, 124 B, 227; 252—514